(12) United States Patent
Alissa et al.

(10) Patent No.: US 11,392,184 B2
(45) Date of Patent: Jul. 19, 2022

(54) DISAGGREGATED COMPUTER SYSTEMS

(71) Applicant: Microsoft Technology Licensing, LLC, Redmond, WA (US)

(72) Inventors: Husam A. Alissa, Redmond, WA (US); Ioannis Manousakis, Redmond, WA (US); Christian L. Belady, Mercer Island, WA (US); Marcus Felipe Fontoura, Medina, WA (US); Ricardo G. Bianchini, Bellevue, WA (US); Winston Allen Saunders, Seattle, WA (US); Mark Edward Shaw, Carnation, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 71 days.

(21) Appl. No.: 17/033,322

(22) Filed: Sep. 25, 2020

(65) Prior Publication Data
US 2022/0100241 A1 Mar. 31, 2022

(51) Int. Cl.
*H05K 7/20* (2006.01)
*G06F 1/20* (2006.01)

(52) U.S. Cl.
CPC ............... *G06F 1/20* (2013.01); *H05K 7/203* (2013.01); *H05K 7/20236* (2013.01); *H05K 7/20318* (2013.01)

(58) Field of Classification Search
CPC ...... G06F 1/20; H05K 7/20236; H05K 7/203; H05K 7/20318
See application file for complete search history.

(56) References Cited

U.S. PATENT DOCUMENTS

| 8,953,317 | B2 | 2/2015 | Campbell et al. |
| 9,092,250 | B1 | 7/2015 | Hyser et al. |
| 9,351,429 | B2 | 5/2016 | Shelnutt et al. |
| 9,713,290 | B2 | 7/2017 | James et al. |
| 10,082,849 | B2 | 9/2018 | Chainer et al. |
| 10,120,727 | B2 | 11/2018 | Bartfai-walcott et al. |
| 10,382,279 | B2 | 8/2019 | Roese et al. |
| 10,512,192 | B2 | 12/2019 | Miyoshi |
| 10,534,598 | B2 | 1/2020 | Salapura et al. |
| 10,601,903 | B2 | 3/2020 | Bivens et al. |
| 2014/0007097 | A1 | 1/2014 | Chin et al. |
| 2014/0218858 | A1 | 8/2014 | Shelnutt et al. |
| 2017/0325355 | A1* | 11/2017 | Lau ................... H05K 7/20381 |

(Continued)

FOREIGN PATENT DOCUMENTS

WO 2019060576 A2 3/2019

OTHER PUBLICATIONS

"Transform How You Manage Your IT Data Center Workloads", In White Paper of Intel, May 22, 2020, 9 Pages.

(Continued)

*Primary Examiner* — Jacob R Crum
(74) *Attorney, Agent, or Firm* — Rainier Patents, P.S.

(57) ABSTRACT

The discussion relates to disaggregated computing. One example can monitor multiple two-phase liquid immersion tanks. Individual two-phase liquid immersion tanks can contain multiple components of a single type of component type. The example can receive requests for virtual machines and allocate sets of components from individual two-phase liquid immersion tanks to work together to support the virtual machines requests.

10 Claims, 13 Drawing Sheets

(56) References Cited

U.S. PATENT DOCUMENTS

| | | | | |
|---|---|---|---|---|
| 2018/0020572 | A1* | 1/2018 | Fujiwara | H05K 7/20763 |
| 2018/0024867 | A1 | 1/2018 | Gilsdorf et al. | |
| 2018/0088997 | A1 | 3/2018 | Min | |
| 2018/0101214 | A1 | 4/2018 | Mahindru et al. | |
| 2018/0343770 | A1* | 11/2018 | Brink | H05K 7/20245 |
| 2019/0090383 | A1* | 3/2019 | Tufty | H05K 7/20263 |
| 2019/0098798 | A1* | 3/2019 | Franz | H05K 7/20509 |
| 2020/0084914 | A1* | 3/2020 | Kumagai | H01L 23/3107 |
| 2020/0288600 | A1* | 9/2020 | Gao | H05K 7/20263 |
| 2020/0305310 | A1 | 9/2020 | Alissa et al. | |

OTHER PUBLICATIONS

Ali et al., "Future Energy Efficient Data Centers with Disaggregated Servers", In Journal of Lightwave Technology, vol. 35, Issue 24, Dec. 15, 2017, 21 Pages.

Dedrick, Joel, "The Need for Disaggregated Cloud Infrastructures", Retrieved from: https://www.sdwanresource.com/articles/441334-need-disaggregated-cloud-infrastructures.htm, Feb. 21, 2019, 3 Pages.

Gao et al., "A study of Direct Liquid Cooling for High-Density Chips and Accelerators", In Proceedings of 16th IEEE Intersociety Conference on Thermal and Thermomechanical Phenomena in Electronic Systems, May 30, 2017, 9 Pages.

Gill et al., "ThermoSim: Deep Learning based Framework for Modeling and Simulation of thermal-aware Resource Management for Cloud Computing Environments", In Journal of Systems and Software, Apr. 13, 2020, 26 Pages.

Patel, Harsh, "Immersion Cooling of High End Data Center Server and Validation Through Experiments", In Thesis of the University of Texas, May 2013, 64 Pages.

Ramakrishnan et al., "Effect of System and Operational Parameters on the Performance of an Immersion-cooled Multichip Module for High Performance Computing", In Proceedings of Semiconductor thermal Measurement and Management Symposium, Mar. 9, 2014, 5 Pages.

Yavari et al., "Temperature and Energy-Aware Consolidation Algorithms in Cloud Computing", In Journal of Journal of Cloud Computing, vol. 8, Aug. 27, 2019, 26 Pages.

Kampl, Alex, "Bitcoin 2-Phase Immersion Cooling and the Implications for High Performance Computing", In Journal of Electronics Cooling, vol. 20, Issue 1, Mar. 2014, 5 Pages.

"International Search Report and Written Opinion Issued in PCT Application No. PCT/US21/036702", dated Oct. 7, 2021, 20 Pages.

* cited by examiner

DISAGGREGATED COMPUTER SYSTEMS

BACKGROUND

Large scale computing systems, such as data centers or server farms, tend to include hundreds or thousands of discrete computers or devices to achieve desired functions or workloads. In such scenarios, the components of the devices are selected and matched for anticipated workloads (e.g., hardware components are selected for the discrete device to match future need). However, workloads actually encountered may be different from the anticipated workloads and these mismatched discrete devices may be underutilized. Further, traditionally these discrete devices have been housed in expansive buildings with huge air handling systems to provide sufficient air flow to remove the thermal load produced by the discrete devices. The present concepts can address these and other issues.

BRIEF DESCRIPTION OF THE DRAWINGS

The accompanying drawings illustrate implementations of the concepts conveyed in the present patent. Features of the illustrated implementations can be more readily understood by reference to the following description taken in conjunction with the accompanying drawings. Like reference numbers in the various drawings are used wherever feasible to indicate like elements. In some cases, parentheticals are utilized after a reference number to distinguish like elements. Use of the reference number without the associated parenthetical is generic to the element. Further, the left-most numeral of each reference number conveys the figure and associated discussion where the reference number is first introduced.

DETAILED DESCRIPTION

The present concepts relate to large scale computing systems, such as data warehouses. Traditional computing systems can employ hundreds or thousands of discrete computers or devices in a datacenter to accomplish an expected workload. Each discrete device can entail multiple computing components, such as CPUs, GPUs, memory, storage, etc. that tend to be physically located in a housing to achieve a compute functionality (e.g., to perform an expected workload). Traditionally, thousands of discrete devices are employed at such locations and ambient air is pumped through the location to cool the discrete devices. This configuration produces a relatively low compute density. Further, moving all of this air requires large amounts of energy and contributes substantially to the energy usage of the datacenter and decreases energy efficiency as measured as a ratio of total energy use by the datacenter divided by energy that is actually used for computing.

As mentioned, in these traditional configurations, each discrete device tends to contain several computing components, such as a processor, memory, storage, etc. to perform the compute functionality. The present concepts involve disaggregation of computing components from a device-centric configuration to a pooled configuration (e.g., sets or pools of physically grouped components of a single component type per pool). In such a case, multiple like components can be positioned in close physical proximity to one another and managed together based upon their properties. For instance, multiple central processing units (CPUs) can be positioned and managed together and multiple memories can be positioned and managed together based upon their properties. The components can be interconnected by a high-speed network that includes and/or is coupled to a communication hub. One challenge of such a disaggregated approach is achieving high compute density. The present concepts can employ cooling techniques that facilitate higher density while still providing effective cooling at lower energy usage than traditional ambient air cooling of distinct devices.

The present concepts can supply cooling techniques that are tailored to the properties of the components in each individual cooling system. In some cases, the present concepts can employ liquid immersion as a technique for pools of components that generate large amounts of heat. Two phase liquid immersion cooling is an especially effective liquid immersion technique for high heat generating components. By managing a single type of computing components together, cooling techniques can be selected for the properties of that computing component type. Further, these pooled components can be arranged at a higher compute density than can be obtained with discrete computers. Also, grouping components together by type allows management options not available with traditional device-centric configurations. These and other aspects are described below.

Figure 1:
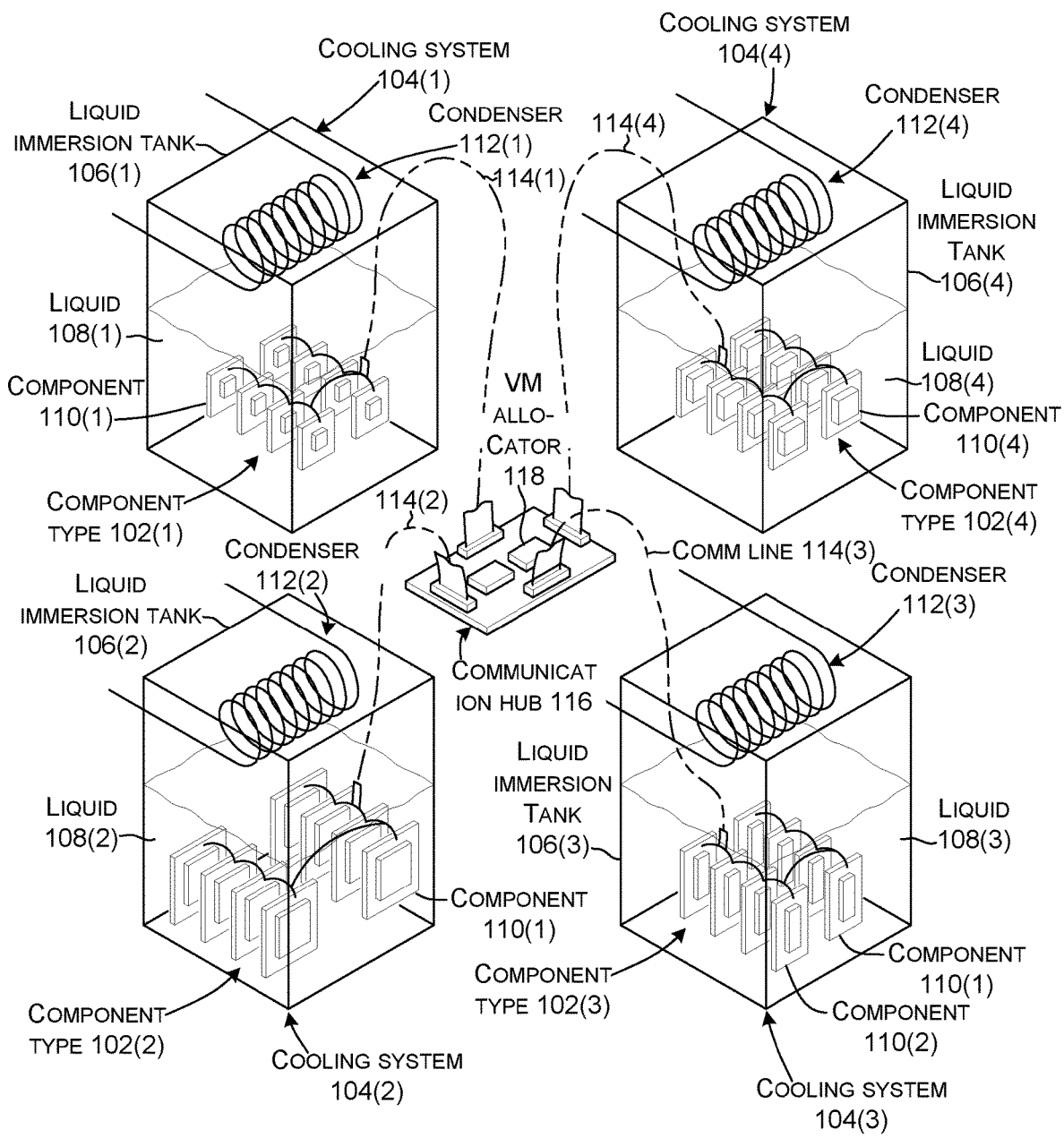
FIGS. 1-5 and 8 show perspective views of example disaggregated systems in accordance with some implementations of the present concepts.

Introductory FIG. 1 shows an example disaggregated system 100A. In this case, the disaggregated system includes multiple computing resource component types (hereinafter, "component types") 102. In the illustrated configuration there are four component types 102(1)-102(4). Individual component types 102 can be associated with a dedicated cooling system 104. In this case, the cooling systems entail liquid immersion tanks 106(1)-106(4). Other cooling system implementations are described below relative to FIG. 2.

In the implementation of FIG. 1, individual liquids 108(1)-108(4) are positioned in the liquid immersion tanks 106(1)-106(4). Multiple components 110 of an individual component type 102 can be contained in the cooling system 104 (e.g., in this case in the liquid 108). In this implementation, the liquid immersion tanks are two-phase liquid immersion tanks. In two-phase liquid immersion tanks, the liquids 108 tend to be electrically insulative, non-corrosive liquids that have a boiling point selected for properties of the respective components.

The liquids 108 for individual liquid immersion tanks 106 can be selected based upon properties of the component type 102 in the individual liquid immersion tank 106. For instance, liquid 108 can be selected that has a boiling point within an operational temperature range, such as below a specified or designed maximum operating temperature of the component type. As such, normal operation of the components 110 will cause the liquid 108 proximate to the components to boil (e.g., change phase from a liquid to a gas). Thus, the liquid immersion tanks 106 can function as two-phase cooling systems. Further, the phase change from liquid to gas involves thermal movement of heat away from the heat generating components 110 as the gas rises through the liquid and away from the component. Thus, the present concepts can leverage thermal movement associated with boiling rather than relying solely on input energy to actively move heat in the system.

In some implementations, components 110 that generate more heat may be paired with a liquid 108 that has a lower boiling point than liquids in other liquid immersion tanks that generate relatively less heat. The lower boiling point can result in more boiling and hence more heat removal from the components by the boiling phase change. Thus, from one perspective, the present concepts can offer cooling solutions that can be customized based upon the components in a given cooling system and/or can leverage thermal movement associated with boiling so energy use associated with forced coolant movement is greatly decreased compared to traditional forced ambient air data centers. Components of different types in a tank do not offer these same advantages because the tank will have to be managed for the most energy sensitive component in the tank.

As mentioned above, multiple components 110 of an individual component type 102 can be positioned in individual liquid immersion tanks 106. (To avoid clutter on the drawing page not all instances of each component are specifically designated, but at least one component 110 is labelled in each liquid immersion tank 106). In the illustrated implementation, eight components are shown in each liquid immersion tank 106. In many implementations, the number of components per cooling system 104 (e.g., per liquid immersion tank 106) can be much greater, such as hundreds or even thousands per liquid immersion tank 106. Such an example is discussed in more detail below relative to FIG. 5.

For purposes of explanation in the present example of FIG. 1, the first component type 102(1) can be manifest as central processing units (CPUs), the second component type 102(2) can be manifest as graphical processing units (GPUs), the third component type 102(3) can be manifest as memory, and the fourth component type 102(4) can be manifest as storage. This is one example of component types 102, and other example component types are described below.

Operation of the components 110 can cause the liquid 108 within an individual two-phase liquid immersion tank 106 to boil (undergo a phase change from liquid to gas). The hot gas rises through the liquid into the space above the liquid at the top of the liquid immersion tank. At this point the hot gas can encounter a condenser 112. Heat can be transferred from the gas to the condenser so the gas cools back below the boiling point and the gas changes back into a liquid and 'rains' back onto the surface of the liquid 108. The condenser 112 can contain a recirculating fluid and can operate in a closed loop that can transport the heat away from the liquid immersion tanks 106 (e.g., outside of the disaggregated system 100A) and then return to the liquid immersion tanks 106 to repeat the process.

Various liquids have suitable properties for use in the two-phase liquid immersion tanks. Suitable liquids tend to be electrically insulative and non-corrosive. However, various coatings or treatments may be applied to the components 110 to mediate corrosion issues. Fluorochemicals provide an example class of liquids that can possess these properties, such as being electrically insulative, non-corrosive, and having suitable boiling points. Commercially available example Fluorochemicals include the Novec brand engineered fluids offered by 3M Corp, among others.

The components 110 of the various liquid immersion tanks 106 can be communicatively coupled by a high-speed network represented by communication lines 114 (not all of which are designated) extending between the components 110 and a communication hub 116. A virtual machine (VM) allocator 118 positioned on, or coupled to, the communication hub 116 can manage the components 110. This aspect will be discussed in more detail below relative to FIG. 5.

As mentioned above, existing datacenters are filled with hundreds or thousands of discrete devices that contain a specified combination of components designed to cover specific demand. This specified combination of components can be referred to as conforming to a stock keeping unit (SKU) or other specification definition. For instance, within a datacenter 1000 devices may have a specified combination of components defined in the SKU (and other devices conforming to other SKUs). For example, the components can entail a processor with 'X' specifications and memory with 'Y' specifications to satisfy expected demand.

Subsequently, the datacenter may receive a request for virtual machines to accomplish a workload. However, the configuration of requested virtual machines may not match the configuration defined by the SKU. For instance, the requested virtual machines may entail less processor capacity and more memory capacity, in one example. In such a configuration, the lack of sufficient memory per discrete device can cause underutilization of the devices in the datacenter and/or fragmentation across the datacenter as attempts are made to match requested virtual machines to the existing discrete devices. Additional devices may be ordered with the demanded configuration, but by the time they are installed, demand may have shifted again. This problem can cause either over provisioning of an individual device configuration leading to wasted unused devices or under provisioning an individual configuration leading to shortages and teams scrambling to purchase and install more dedicated devices on a hectic schedule.

The present extreme disaggregation concepts can reduce and potentially eliminate the waste and shortages of fragmentation by virtualizing SKUs. The virtual SKU can be accomplished from the components 110 from each of the cooling systems 104 to exactly match the requested virtual machines. Thus, individual components 110 from each cooling system 104 can be allocated as defined in the virtual SKU (e.g., as defined by the requested virtual machines) with the other components remaining available for other SKUs. For instance, virtual machines can be requested for two devices or (two hundred or two thousand devices) that each have one CPU component with 'W' specs, one GPU component with 'X' specs, one memory component with 'Y' specs, and two storage components with 'Z' specs. The present concepts, such as implemented by the VM allocator 118, can allocate two CPUs from liquid immersion tank 106(1), two GPUs from liquid immersion tank 106(2), two memory from liquid immersion tank 106(3), and four storage from liquid immersion tank 106(4) as a virtual SKU to satisfy the requested virtual machines. Thus, there are no 'lost' components due to device-centric ratios. Of course, the numbers of components mentioned in this example is lower than would normally occur because the number of components illustrated in the individual cooling systems 104 is lowered to simplify the line drawings.

Figure 2:
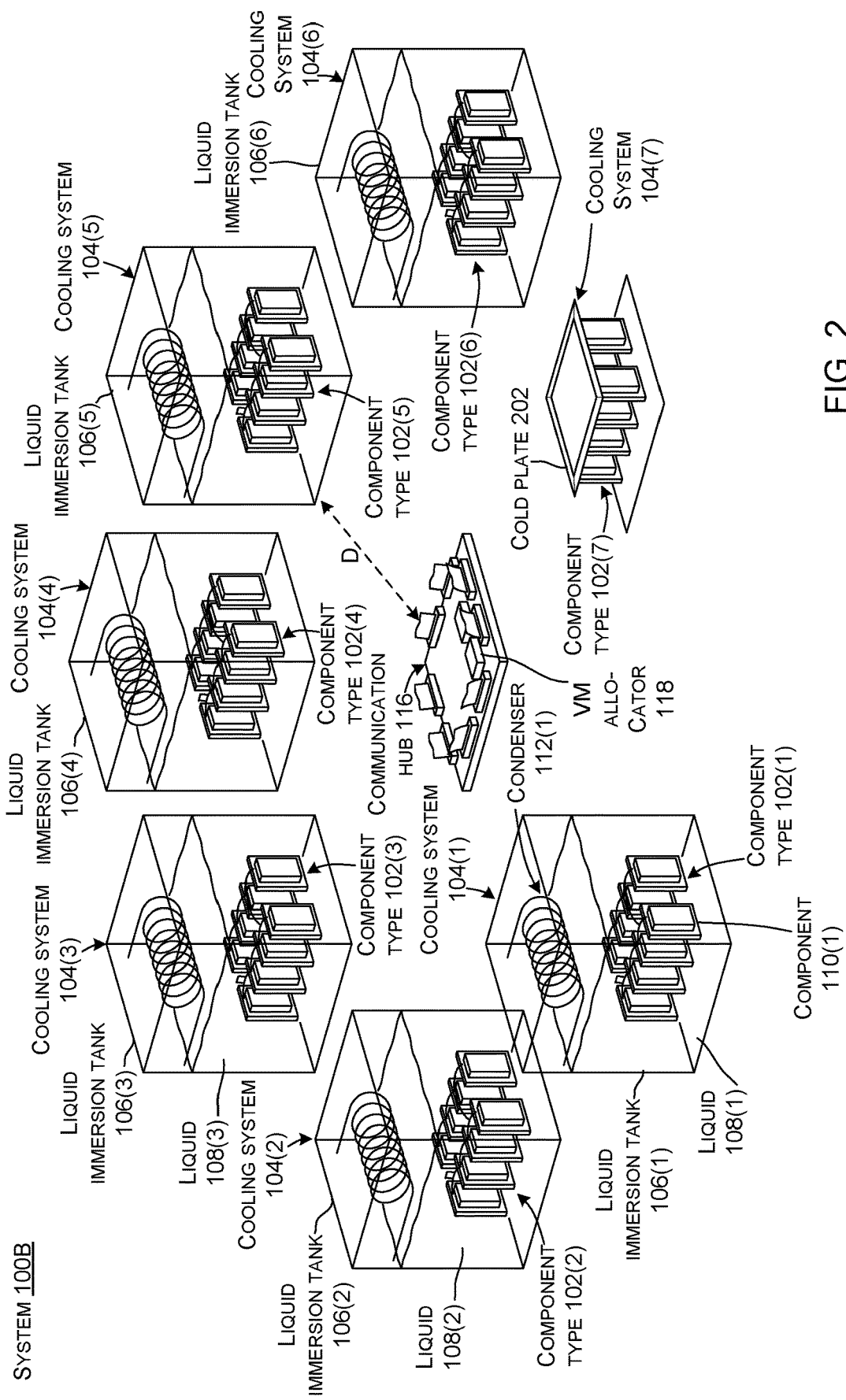

FIG. 2 shows another example disaggregated system 100B. (The use of the suffixes, such as 'A' and 'B' is intended to indicate that the elements of these systems may be the same or different and/or that a given element that appears in both systems may be the same or different between systems). In this case, example disaggregated system 100B includes seven cooling systems 104(1)-104(7). Cooling systems 104(1)-104(6) entail two-phase liquid immersion tanks 106(1)-106(6). Cooling system 104(7) entails a cold plate 202. Other cooling systems that are tailored to the properties of the contained component type 102, such as heat density and/or maximum component operating temperature, among others, are contemplated. For instance, some component types may be adequately cooled at high component densities with a single-phase liquid immersion cooling system, while others can only be adequately cooled at a desired component density with two-phase cooling.

For purposes of explanation, in this example the first component type 102(1) can entail CPUs, the second component type 102(2) can entail memory, the third component type 102(3) can entail GPUs, the fourth component type 102(4) can entail storage, the fifth component type 102(5) can entail accelerators, the sixth component type 102(6) can entail flash memory, and the seventh component type 102(7) can entail overclocked CPUs. While not used in this example, overclocked GPUs and/or other overclocked components are also contemplated. The communication lines 114 described above relative to FIG. 1, are omitted in FIG. 2 to reduce clutter on the drawing page.

In this implementation, the cooling systems 104 are positioned radially around the communication hub 116 (e.g., the communication hub is centrally positioned at the focus) at approximately (e.g., substantially) equal distances, such as +/−one inch or +/−10%. This configuration can provide high component density, while providing similarly short communication line path lengths between the components 110 of the various cooling systems 104 and the communication hub 116 (e.g., the distance D between the components in each cooling system and the communication hub can be approximately (e.g., substantially) equal and can be relatively short when compared to air cooled configurations). For instance, in some configurations, the communication lines can be less than one foot in length and can be within +/−10% in length. In other cases, the communication lines can be even shorter, such as less than eight inches in length. The shorter lengths offered by these dense configurations can reduce latency associated with signal traveling within the system.

Figure 3A:
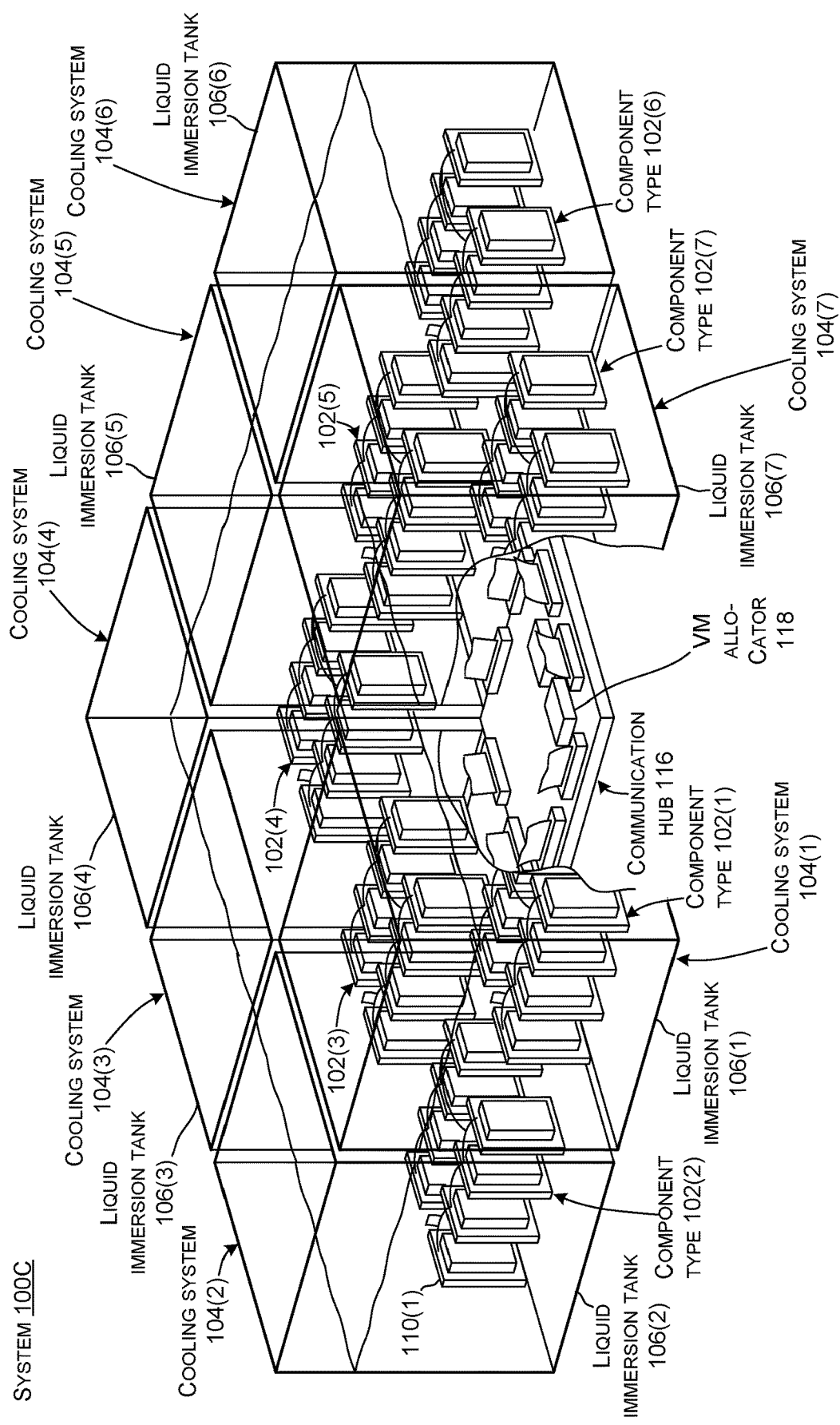
Figure 3B:
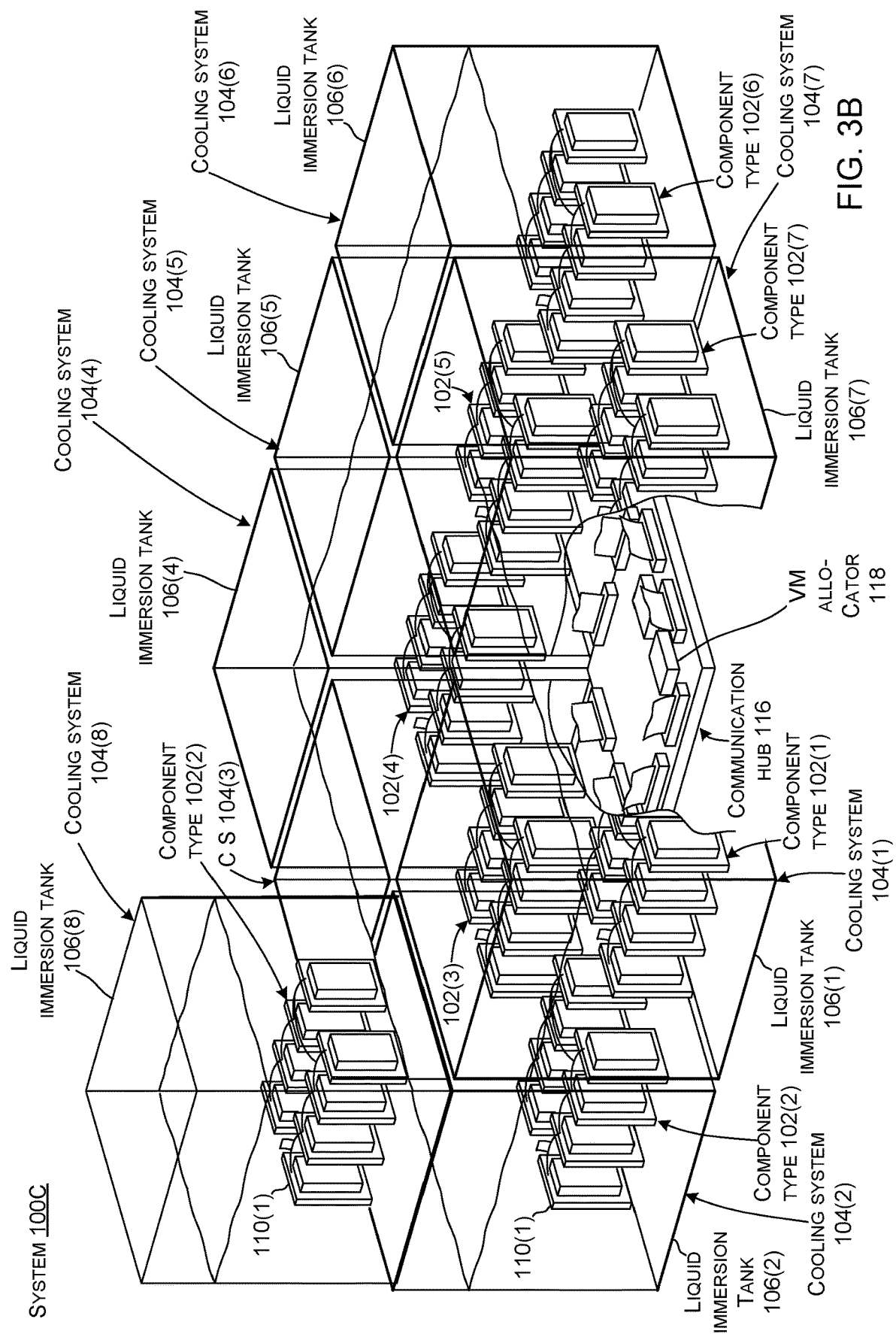

FIGS. 3A and 3B collectively show another example disaggregated system 100C. This example system is similar to the disaggregated system 100B of FIG. 2 and as such the elements will not be re-introduced. One exception is that in this case, all of the cooling systems 104 are manifest as liquid immersion tanks 106. Further, while not shown, an eighth cooling system could be included in the cut-away position facing the reader on the drawing page.

In this case, the cooling systems 104 are arranged in an array (e.g., 3×3 grid array) with the communication hub 116 occupying the central position. This configuration can provide very high component density. For instance, in one example, the liquid immersion tanks 106 can be generally cube-shaped. For example, the liquid immersion tanks could be less than one foot on a side and each liquid immersion tank could contain at least one hundred components 110 of a given component type. Thus, a volume of nine cubic feet could hold at least 100 components of eight different component types 102 in eight different cooling systems 104. In another configuration, each liquid immersion tank can hold 1000 components, for example. In still another example configuration, the liquid immersion tanks could be eight inches on a side and contain more than one hundred components. Thus, the system could occupy less than four cubic feet while containing at least 100 components of eight different component types 102 in eight different cooling systems 104. Similarly, a thousand of each component could be contained in the nine cubic ft system mentioned above.

The high component density offered by the present implementation can facilitate tight coupling of the components 110 of the various component types 102. This coupling can be facilitated by connecting the components 110 to the communication hub 116 by high performance interconnects (e.g., communication lines 114 of FIG. 1) with high bandwidth and low latencies. This configuration allows software running on the components to experience similar performance (e.g., latency) between the pooled components and existing physically dedicated hardware strategies (e.g., discrete devices).

Given that latencies generally increase when signals cross through chips or travel large distances, latency can be reduced when the components 110 are tightly packed together as illustrated in FIGS. 2 and 3A-3B. Thus, the high component density and short communication line lengths can allow the disaggregated system 100C to operate without redrivers or retimers between the components of different cooling systems and/or between the components and the communication hub 116. Stated another way, the physical architecture can provide high densities of desired component configurations with low latency and without the additional complexity of redrivers and retimers. A redriver can be viewed as an element that amplifies a signal. A retimer can also amplify a signal and can resynchronize the signal to the system clock as well.

As mentioned above, the length of the communication lines 114 associated with distance D (FIG. 2) between the components 110 and the communication hub 116 can be a substantial contributor to latency between components 110 of different component types 102 (e.g., in different cooling systems 104) and/or between the components and the communication hub 116. For instance, when electrical signals are conveyed along the communication lines, the distance between the CPUs and the memory can contribute to the latency such that a maximum length of the communication lines can be calculated that still allows latency parameters to be satisfied. In some cases, optical technologies tend to be faster than electrical technologies and thus allow longer communication lines to be employed. The desired latency between the processors and the memory, among others, can be a dominate consideration in determining communication path length in a disaggregated system. Technologies such as space optics, coherent accelerator link/compute express link (CXL/CAPI), (Optical vs Electrical) can be employed to provide the communication lines in some implementations.

The illustrated implementation of FIGS. 3A and 3B also lends itself to easy component ratio re-alignment. For ease of explanation, assume that expected demand can be satisfied with 500 components (of the various component types) in each liquid immersion tank 106. However, over time the demand is dictating a higher number of components 110 of component type 102(2) in liquid immersion tank 106(2) relative to the other components in the other liquid immersion tanks.

FIG. 3B shows an example of the ready adaptability offered by the present concepts to accommodate changing demand. In this case, an eighth liquid immersion tank 106(8) is added to disaggregated system 100C. This liquid immersion tank 106(8) can contain the same component type 102(2) as liquid immersion tank 106(2), thereby increasing the number of components of this component type relative to the components of other component types. Further, these additional components (contained in liquid immersion tank 106(8)) can be added to the disaggregated system 100C without interfering with any other components (e.g., without causing the existing components to be offline or otherwise unavailable for a period of time). In this case, the additional components of liquid immersion tank 106(8) can simply be coupled to the communication hub 116 via communication lines (shown FIG. 1). The additional components can be automatically detected by the VM allocator 118. The VM allocator can then add the additional components 110 to a listing (e.g., pool) of the components of this component type 102(2). These additional components can then be dynamically allocated to accommodate demand. This aspect is described in more detail relative to FIG. 6.

While this example is explained in relation to adding capacity to accommodate changing component ratios in demand, the example is equally applicable in scenarios involving component failure and/or avoiding outages associated with component failure. For instance, assume that the VM allocator 118 includes a predefined threshold for component failure and/or component lifespan. If a number of components 110, such as 10% for example, in a single liquid immersion tank 106 exceeds the predefined threshold due to failure or 'age out' (e.g., exceeding expected lifespan), the VM controller 118 can generate a notification requesting installation of an additional liquid immersion tank containing that component type that is exceeding the predefined threshold. Again, these supplemental components can be installed without interrupting the existing components.

The previously illustrated implementations have arranged all of the cooling systems 104 and the communication hub 116 as a single layer (e.g., positioned on a planar surface). FIG. 3B illustrates that other implementations can be multilayer. For instance, another set of liquid immersion tanks could be positioned on top of liquid immersion tanks 106(1)-106(7) in a similar manner to liquid immersion tank 106(8) to essentially double capacity while only increasing communication path lengths slightly. Further implementations could resemble a Rubik's cube, such as with the communication hub 116 occupying the central position and cooling systems 104 containing a single component type 102 positioned in three dimensions around the communication hub.

Figure 4:
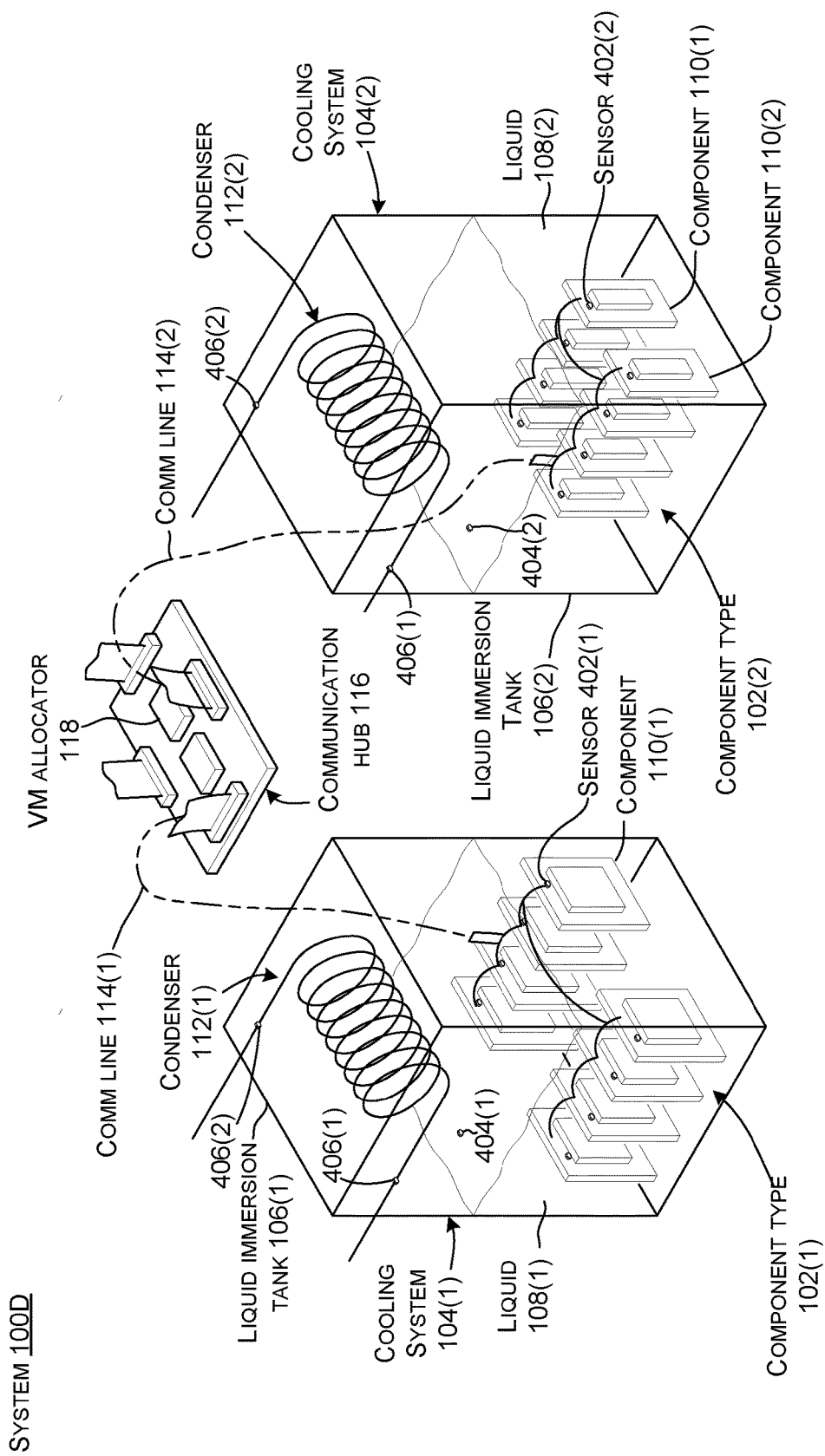

FIG. 4 shows portions of another example disaggregated system 100D. In order to increase the size and detail of the illustrated elements, only two cooling systems 104(1) and 104(2) are shown, but the system can include additional cooling systems with other component types. For purposes of explanation, assume that cooling system 104(1) is dedicated to component type 102(1) that entails CPUs and cooling system 104(2) is dedicated to component type 102(2) that entails overclocked CPUs. In this case, the communication lines 114 also include power lines for the components 110. The VM allocator 118 can control power levels (e.g., current and/or voltage) supplied to individual components via the power lines.

The VM allocator 118 can utilize various parameters for managing operation of the components 110 of any of the cooling systems 104. The parameters can relate to the age of the component, operational age of the component, actual (e.g., current) operating temperature of the component, designed operating temperature range of the component, temperature of the liquid 108, temperature of the secondary cooling system, boiling point of the liquid 108, dielectric constant of the liquid 108, overall cooling capacity of the cooling system, specified (designed) operating power of the component, specified (e.g., designed) operating voltage of the component, specified (designed) operating current of the component, actual operating (e.g., driven) power of the component, actual operating (e.g., driven) voltage of the component, and/or actual operating (e.g., driven) current of the component, among others. Note that the specified operating power, specified operating voltage, and/or specified operating current may be a single value, such as 0.5 Watts or a range, such as 0.4-0.6 Watts, for example or both a current and a voltage (e.g., 0.1 amp at 10 volts, for example).

As mentioned above, in two-phase liquid immersion tanks 106, the liquid 108 can be selected that has a boiling point that lies within an operating temperature range of the component type 102 in the tank. For instance, if the operating range of the components is 45-55 degrees Celsius (C), a liquid can be selected that has a boiling point within this range, such as 50 degrees C. In some cases, the device manufacturer may specify only an upper end of the operating temperature range (e.g., a maximum operating temperature). In such a case, the boiling point of the selected liquid can be below the maximum operating temperature. Boiling of the liquid into a gas effectively captures large amounts of heat and carries the heat away from the component as the gas rises to the surface of the liquid. The boiling point of the liquid may also relate to the amount of heat generated by the component. For instance, a given CPU may have a maximum operating temperature of 100 degrees C. If the CPU is going to be driven at specified powers to achieve specified frequencies, a liquid with a boiling point of 60 degrees C. may be selected for example. However, if the CPU is going to be driven at higher powers to achieve greater frequencies, a liquid with a lower boiling point, such as 50 degrees C. may be selected to increase the amount of boiling and hence heat removal.

Disaggregated system 100D includes several sensors configured to sense values for at least some of these parameters. For instance, system 100D can include temperature sensors 402, 404, and/or 406, among others. In this case, temperature sensors 402 are positioned on one or more of the components 110 of each cooling system 104. The temperature sensors 402 can provide temperatures of the component during operation. In this case, a temperature sensor 402 is positioned on each component, though not all of these temperature sensors are designated with specificity to avoid clutter on the drawing page. Temperature sensors 404 are positioned to sense the liquid 108 of the cooling systems 104. Temperature sensors 406 can provide input and output temperatures of the secondary cooling system that transports heat from within disaggregated system 100D to external to the system. Other sensors that are not specifically illustrated can relate to the current and/or voltage that individual components are driven and the duration that they are driven.

The VM allocator 118 can use values of these parameters as input when managing various component types and/or components within a component type. For instance, the VM allocator may select a set of components of each component type for a first virtual SKU to satisfy a first workload (e.g., to run a first set of virtual machines) and a second different set of components of each component type for a second virtual SKU to satisfy a second workload (e.g., to run a second set of virtual machines). Note that some virtual SKUs may not include each component type. For instance, an individual virtual SKU may not include overclocked GPUs. In such a case, the set of selected overclocked GPUs would be zero and the overclocked GPUs remain available for other virtual SKUs.

The sets of selected components for a given workload can be communicatively coupled by the VM allocator 118 and driven at defined parameter values. Deviations from defined parameter values and/or parameter values of other components of the set may be monitored as an indicator of component health. For instance, a CPU that suddenly gets hotter than other CPUs of the set and/or starts to draw more current may be indicative of damage. The VM allocator can take various management actions, such as removing the CPU from the set and replacing it with another available CPU from the same cooling system 104.

The VM allocator 118 can also manage components 110 of individual component types 102, such as CPUs and GPUs that are operated outside of design specifications. Overclocked components are especially subject to premature failure if not properly managed and the VM allocator can manage the overclocked components to achieve high performance while protecting the component from damage. For instance, the VM allocator can drive the overclocked CPUs and/or GPUs at higher powers than design specs to achieve operating rates (e.g., overclocked rates) above the designed clock rates. However, the VM allocator can utilize the CPU/GPU temperatures from sensors 402 to ensure they do not exceed the defined operating temperatures when they are operated above design specifications. The VM allocator can also compare the heat being generated by the overclocked components within an individual cooling system to the overall cooling capacity of the cooling system to ensure that sufficient capacity exists to remove the heat from the cooling system. To manage the additional heat generated by overclocked components, the liquid 108 may be selected with a lower boiling point than would otherwise be selected. For instance, if the manufacturer's suggested (e.g., designed) maximum operating temperature is 80 degrees C., for normal operation a liquid with a boiling point of 60 degrees C., for example, may be selected. However, for that same component driven overclocked, a liquid with a boiling point of 50 degrees C., for example, may be selected to increase boiling during operation and hence remove more heat from the component. Thus, the VM allocator 118 can utilize the properties of the liquid 108 and the component 110 as parameters when determining how to manage the components.

As mentioned above, the VM allocator 118 can utilize multiple parameters to determine how to operate the components 110. For instance, when the workload is low or the need for speed offered by overclocking is unneeded, the VM allocator may drive the 'overclocked' component at a power that causes the component to stay within the manufacturers operating range by controlling power and monitoring component temperature. At this point the overclocked component may not actually be overclocked. If workload increases or the need for higher frequency processing increases, the VM controller may drive the component at power levels that cause the component to operate faster than the manufacturer's specifications (e.g., overclocked). These power levels can allow the component to perform faster. However, the power levels may cause the component temperature to rise toward the maximum operating temperature. If the temperature gets within a predefined threshold buffer of the maximum operating temperature, the VM allocator may change how the component is managed. For instance, the VM controller may temporarily lower the driving power.

Alternatively or additionally, the VM controller 118 may identify other idle or underutilized components 110 of the same component type 102 (e.g., in the same cooling system) to which the VM controller can offload some or all of the workload so that overheating of the individual component is reduced or eliminated. The present implementations offer the possibility of other available components at much less cost than traditional device centric datacenters. In the present implementations, the component is grouped with other components of the same type as a pool of components so that individual components can be treated as fungible units and readily swapped for one another.

The VM controller 118 can dynamically allocate components 110 of the pool (e.g., of the same component type 102). For instance, the VM controller 118 can determine how to manage the components 110 of a component type 102 based upon the workload and multiple other parameters. For example, the various parameters can relate to whether there are other idle components available, the temperature of the component currently allocated to the workload (e.g., whether the component is hotter than other components in the cooling system), etc. Further, this dynamic allocation can be achieved without any diminished performance (e.g., increased latency) because the substitute component has basically the same path length as the component (e.g., the two components can be equivalents from a workload or compute perspective).

In contrast, in traditional datacenters, a substitute component or a substitute discrete device will be farther away and will cause diminished performance at least because of increased latency. Thus, the VM controller 118 can consider multiple parameters to balance component lifetime versus workload performance. Additionally, the VM controller can draw from an entire pool of similarly situated components within the pool without diminishing performance or idling or otherwise underutilizing components of other component types. This aspect will be discussed in more detail below relative to FIG. 5.

Figure 5:
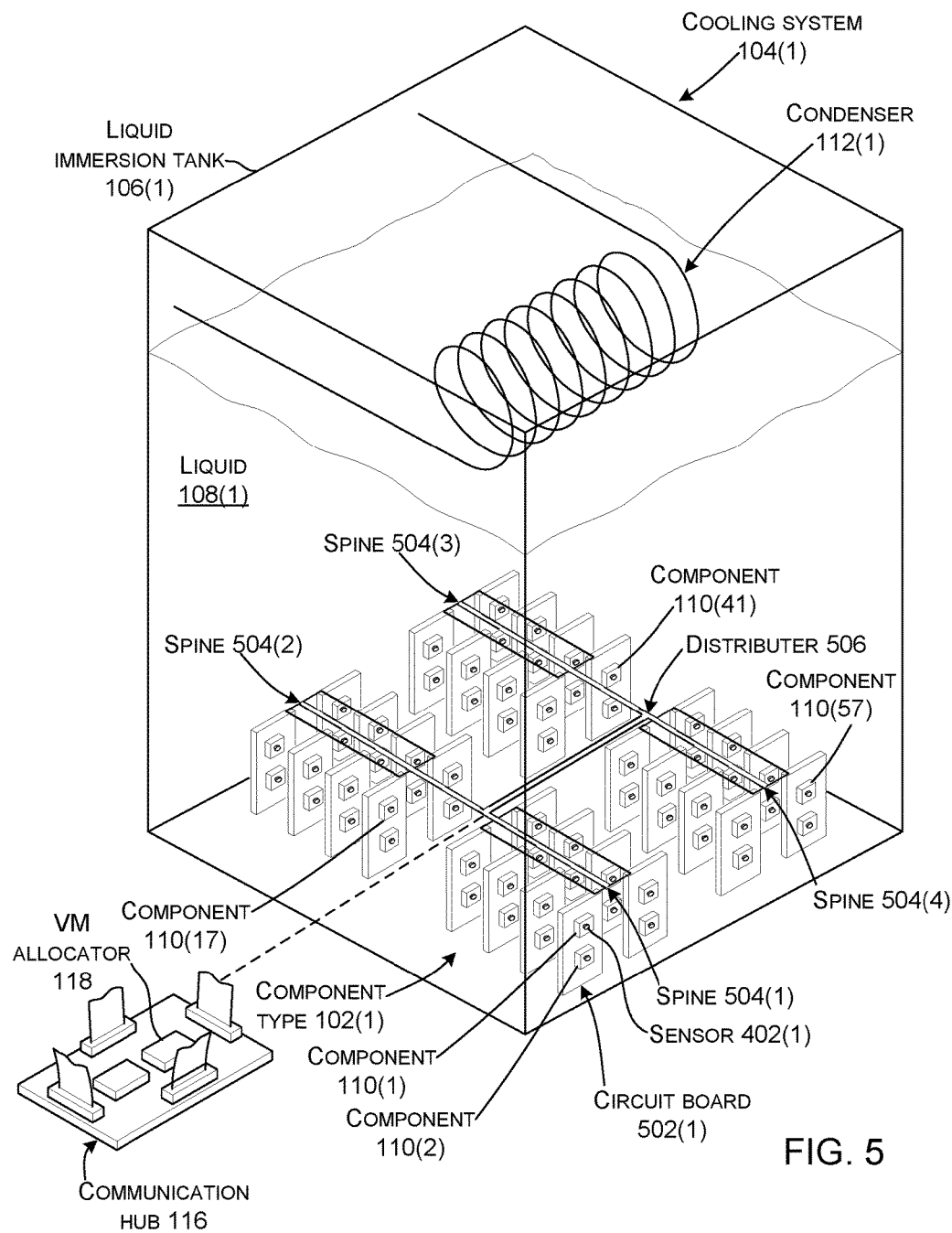

FIG. 5 shows portions of another example disaggregated system 100E. In order to increase the size and detail of the illustrated elements, only one cooling system 104(1) containing a single component type 102(1) is shown, but the system can include additional cooling systems with other component types. In this case, two components 110 are positioned on each circuit board 502. The circuit boards 502 and hence the two components 110 can be physically and/or communicatively coupled to spines 504. Multiple spines can be physically and/or communicatively coupled to a distributer 506. The distributer 506 in turn can be coupled to, or be part of, the communication hub 116.

In this implementation, sensors 402 are positioned on components 110 to sense the component temperature. In this example, each spine 504 is associated with eight circuit boards and 16 components, though other numbers of circuit boards and/or components are contemplated. Further, the illustrated configuration includes four spines 504, but other configurations may include fewer or more spines. For instance, dozens or hundreds of spines could be coupled to a distributer 506 in a cooling system 104 in some configurations. Note also, that while a single horizontal layer of components 110 (e.g., circuit boards 502) are illustrated relative to a single horizontal arrangement of spines 504, multiple similar layers could be stacked vertically (e.g., additional layer(s) of circuit boards and spines positioned on top of the illustrated layer) to increase the density of components in the cooling system 104 (e.g., in the liquid 108).

As mentioned above, the VM allocator 118 can manage the components 110. For purposes of explanation, assume that of the 64 illustrated components 110, the VM allocator allocates 30 components (e.g., components 1-30) to a first SKU and allocates 30 other components (e.g., components 31-60) to a second SKU, while the remaining four components (e.g., components 61-64) provide failure protection. Among other parameters, the VM allocator 118 can track the operating temperature and the operational life of the components 110 and can use this information to manage the components 110.

The VM allocator 118 can dynamically swap components 110 to optimize component lifespan and/or performance. For instance, the VM allocator may monitor components 1-30 as they perform the first workload. If the VM allocator detects deviation of one of these components (relative to its past parameter values and/or relative to other components of the set), such as a higher operating temperature than the other components, it can take an action. For instance, one such action could be dynamically reallocating the workload from the deviating component to one of the extra components 61-64. Further, the VM allocator 118 may proactively manage the components so that the components age generally equally. For instance, VM allocator 118 can rotate components 1-30 and 61-64 so that 30 components are performing the first workload at any one time and four are available on standby. Thus, after a period of time, say a year, the components 110 in cooling system 104 are not only the same physical age, but they have also performed similar work over that time.

From one perspective, while the system 100E can include spare components 110 to cover component failure, these components are not wasted. Further, the VM allocator 118 can track when the components of the cooling system 104 are aging out, such as based upon physical age, percentage of failures, and/or workload performed. For instance, when the components of the cooling system reach a predefined physical age and/or work age, the VM allocator can send a notice to have the cooling system replaced by another cooling system of the same component type. (One such example is described above relative to FIG. 3B). Similarly, if the cooling system experiences a number of component failures, such as on a percentage basis or such that a number of standby components falls below a defined threshold number, the VM allocator can send a notice to replace the cooling system with another cooling system of the same component type. While discussed relative to components of a single cooling system, the VM allocator can simultaneously perform this management function for all of the cooling systems containing the various component types.

Figure 6A:
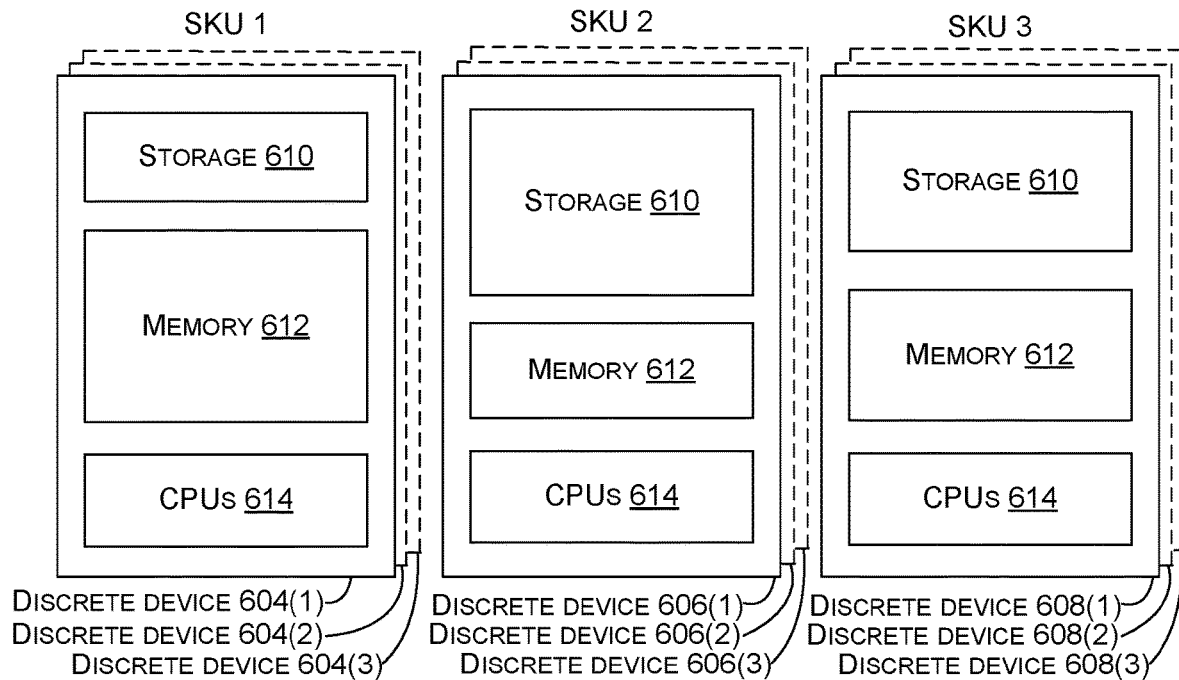
FIGS. 6A-7C show elevational views of example systems in accordance with some implementations of the present concepts.

FIGS. 6A-6E collectively show examples of how the present disaggregation concepts differ from traditional data center configurations. FIG. 6A shows traditional discrete servers or devices 602 of a traditional datacenter. The discrete devices 602 have components defined by SKUs 1, 2, and 3, for example. In this case, three discrete devices 604 are illustrated that have components defined by SKU 1, three discrete device 606 that have components defined by SKU 2, and three discrete devices 608 that have components defined by SKU 3. Of course, any number of discrete devices can relate to each SKU. For instance, 1,000 discrete devices could relate to each SKU, for a total of 3,000 discrete devices in the data center, for example. In this case, the illustrated components are storage 610, memory 612, and CPUs 614. In this example, each discrete device includes each component, but the ratios are different between different SKUs. The SKUs define the hardware components for a discrete device that are appropriate for an expected workload (e.g., software running on the hardware and the type of processing performed by the software). As mentioned above, the discrete devices are built in advance and may or may not match the actual requested workload. As mentioned above, there can be more component types 102 than are shown here and not all SKUs include all component types. The illustrated configuration is provided for purposes of explanation.

Figure 6B:
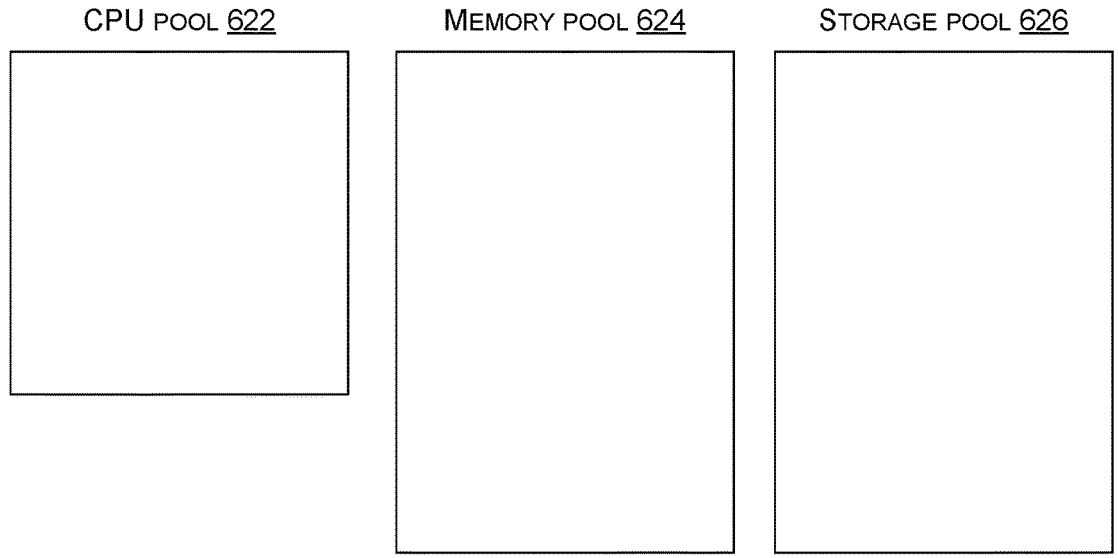

FIG. 6B shows disaggregated compute pools 620. Assume for purposes of example, that the disaggregated compute pools 620 include the same components (3,000 of each component) as FIG. 6A, however, the components are grouped or pooled together by component type in separate cooling systems. This aspect is described above. In this case, the CPUs 614 are grouped into a CPU pool 622, the memory 612 is grouped into a memory pool 624, and the storage 610 is grouped into a storage pool 626. The individual pools of components are examples of component types 102 that can be contained in cooling systems 104. These aspects are discussed above relative to FIG. 1.

Figure 6C:
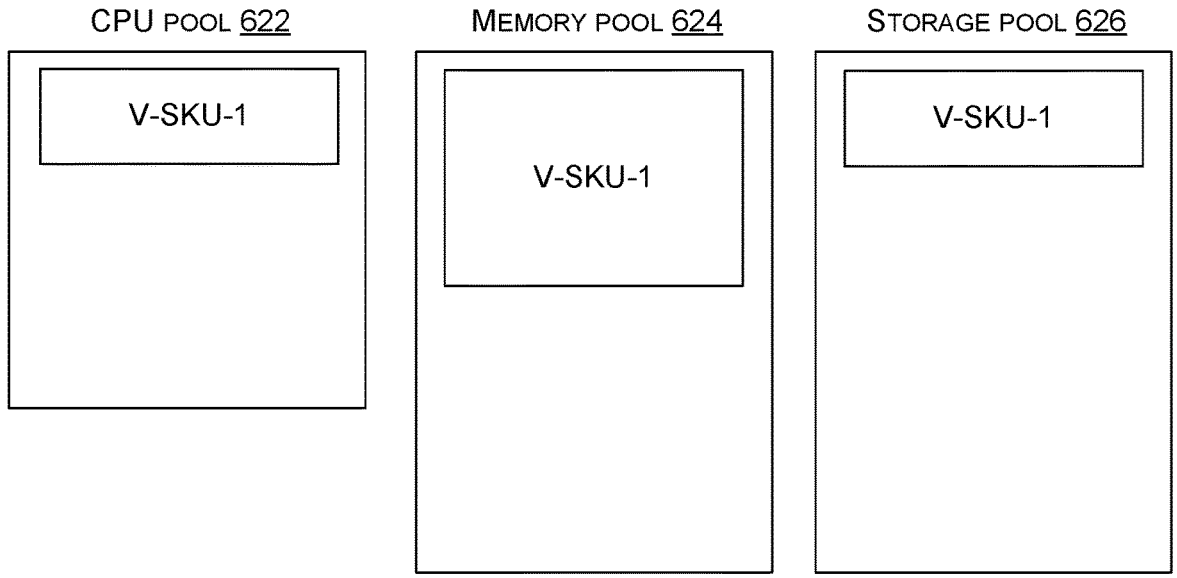

FIG. 6C shows how CPUs in the CPU pool 622, memory in the memory pool 624, and storage in the storage pool 626 can be allocated to virtual SKUs (V-SKUs). As mentioned above, this allocation can be performed by the VM allocator 118 in some implementations. In this case, components from each component pool (622, 624, and 626) are allocated to V-SKU-1. Note that the proportions or ratios of the components can be the same as those of SKU-1 of FIG. 6A. Note that this allocation can be performed in real-time (e.g., when the workload request is received) rather than in advance so there is no chance of mismatch as there is with the traditional configuration of FIG. 6A.

Figure 6D:
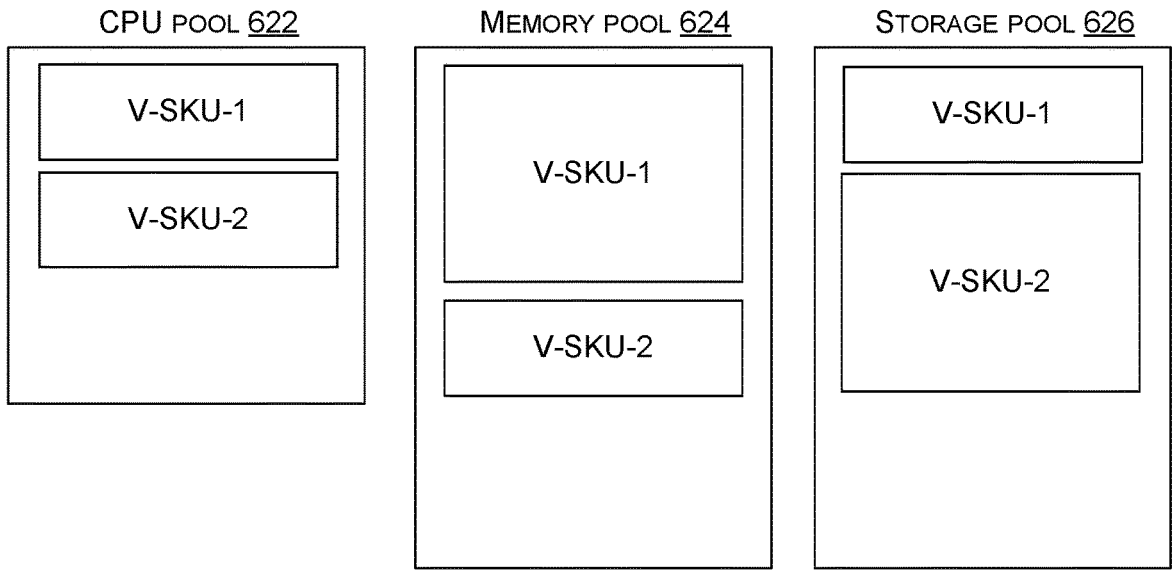
Figure 6E:
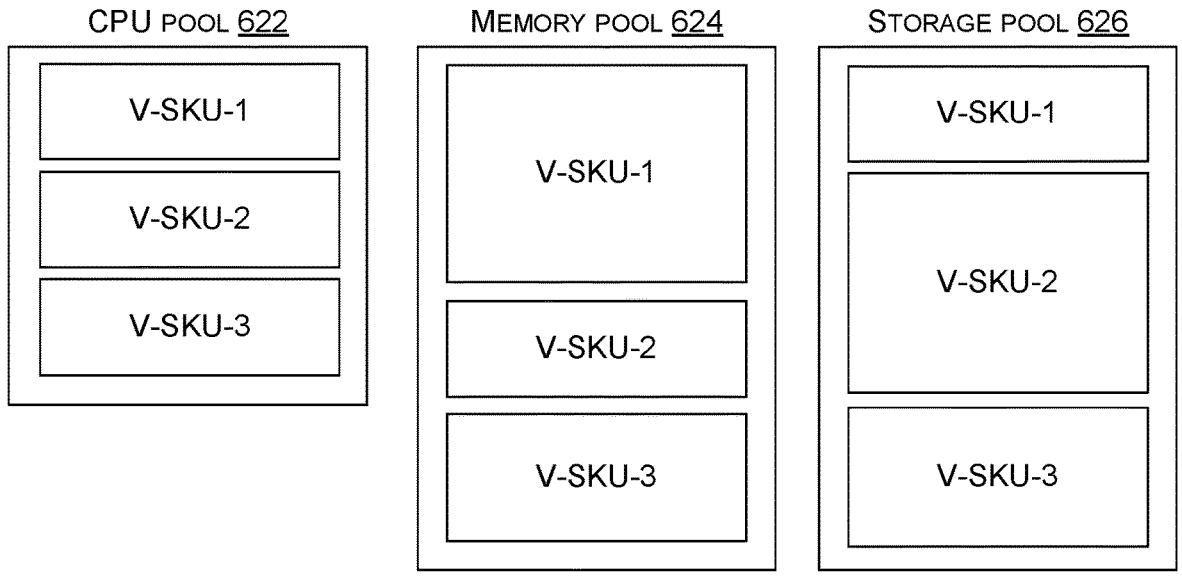

FIG. 6D shows how components from each component pool (622, 624, and 626) are allocated to V-SKU-2. Note that the proportions or ratios of the components can be the same as those of SKU-2 of FIG. 6A. Similarly, FIG. 6E shows how components from each component pool (622, 624, and 626) are allocated to V-SKU-3. Note that the proportions or ratios of the components can be the same as those of SKU-3 of FIG. 6A. However, rather than having to power up an entire device, in this configuration, the VM allocator can simply power on the specific components that are being utilized. This can add additional power savings to the power savings mentioned above relating to not having to actively move the high volumes of air required by traditional datacenters.

Figure 7A:
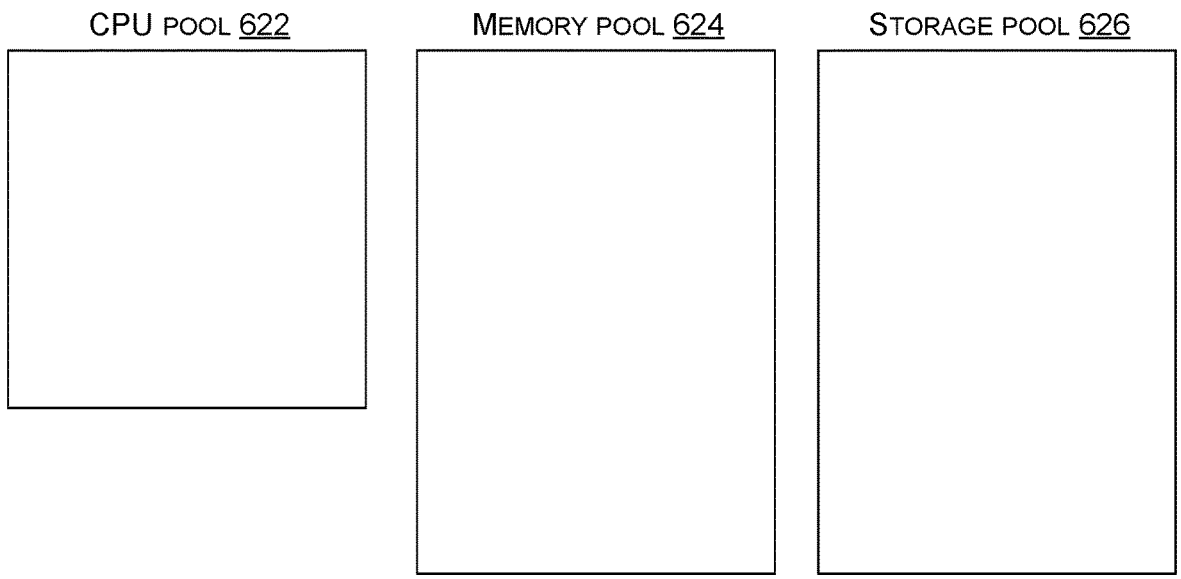
Figure 7B:
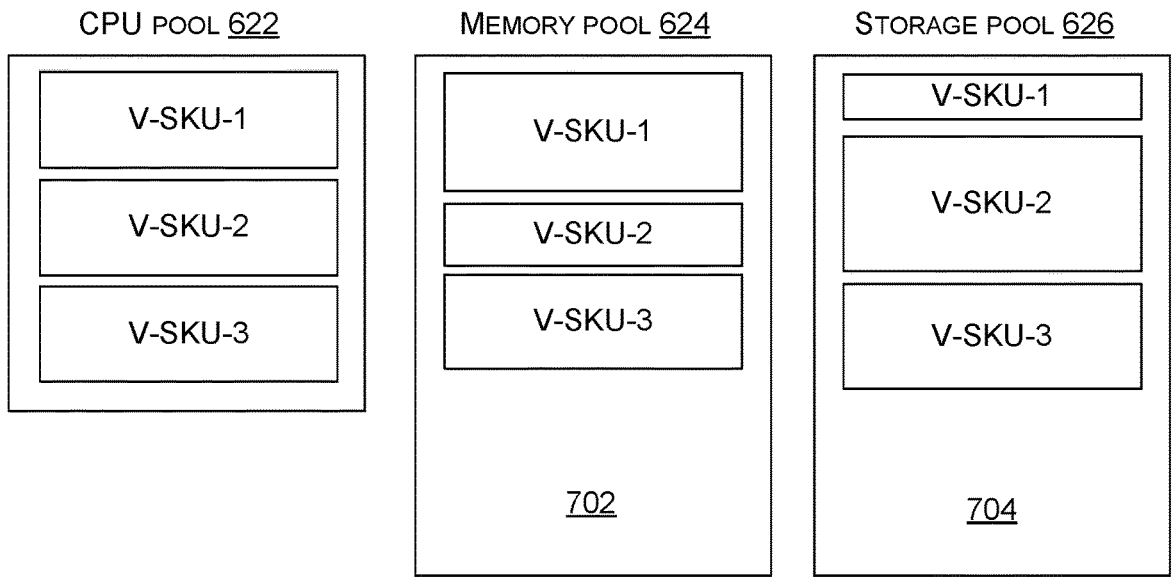
Figure 7C:
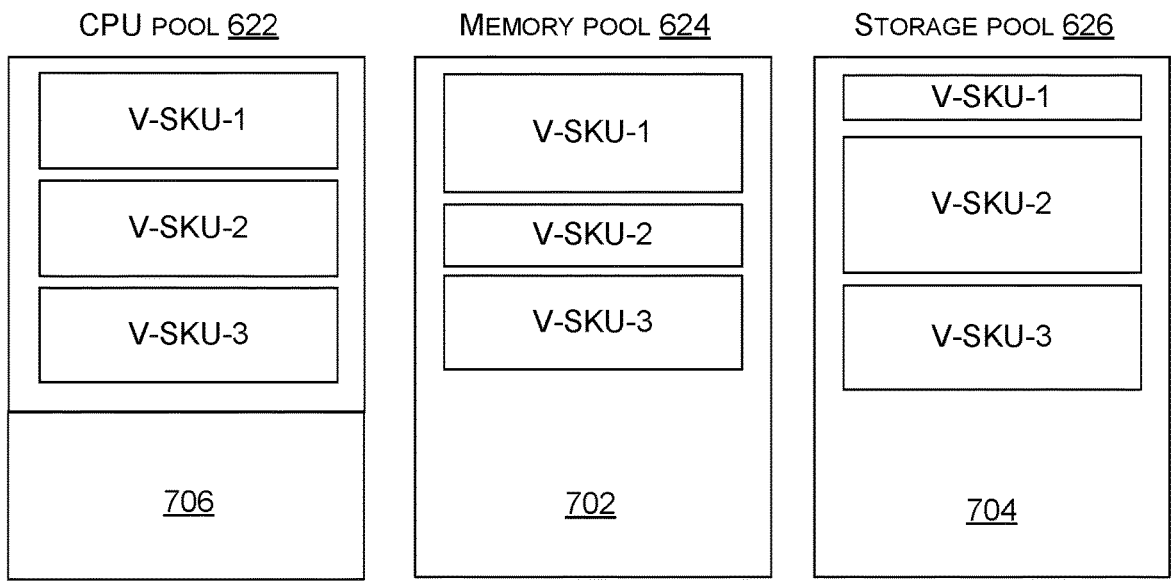

FIGS. 7A-7C collectively show another example of the present disaggregation concepts relative to another disaggregated compute pool 620A. In this case, FIG. 7A shows the same three pools of components as FIGS. 6B-6E. In this example, there is a given ratio of components in the three respective pools represented by the height of each pool. In some cases, selection of the ratios could be based upon projected demand and/or past demand.

FIG. 7B shows disaggregated compute pool 620A allocated to requested workload corresponding to three virtual SKUs (V-SKU-1, V-SKU-2, and V-SKU-3). Note that in this case, the requested workload did not match the projected workloads. This is reflected in that almost all of the CPU pool 622 is allocated, whereas the memory pool 624 and the storage pool 626 have unused capacity, 702 and 704, respectively.

FIG. 7C shows how additional CPUs can be added to the CPU pool 622 as indicated at 706. This aspect was discussed above relative to FIG. 3B and can be accomplished on the fly (e.g., without interrupting the operation of the existing CPUs in the CPU pool 622). For instance, an additional cooling system containing CPUs can be added to increase the CPUs in the CPU pool 622. Thus, additional CPU capacity can be added so that the unused memory resources and storage resources are not wasted or lost (e.g., they can now be allocated to a new SKU with the added CPU resources). Further, the additional CPU capacity can be added without interrupting functioning of the existing resources.

Figure 8:
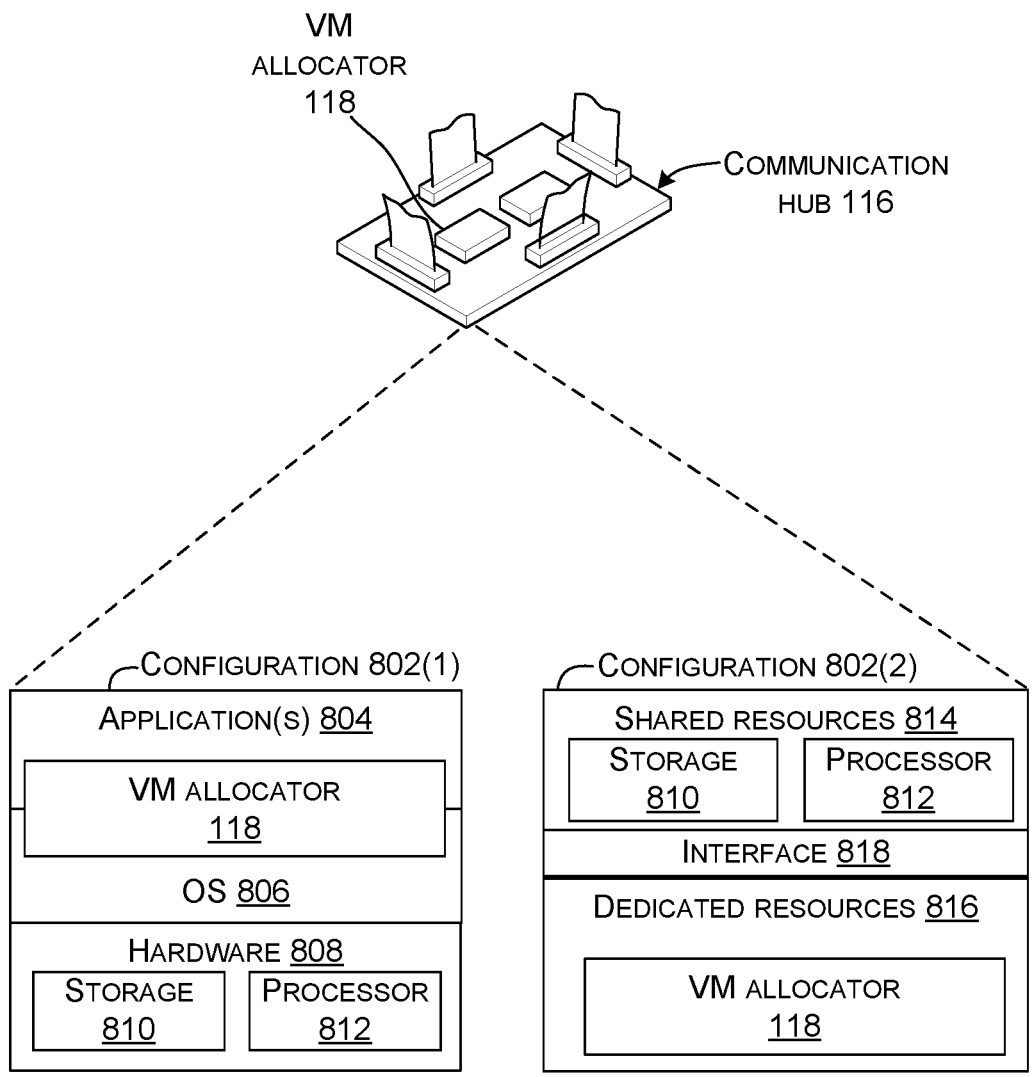

FIG. 8 shows an example VM allocator 118 implementation that can accomplish the present concepts. For purposes of explanation, FIG. 8 shows two implementation configurations 802 for the VM allocator. Briefly, configuration 802(1) represents an operating system (OS) centric configuration. Configuration 802(2) represents a system on a chip (SOC) configuration. Configuration 802(1) is organized into one or more applications 804 and operating system 806 running on hardware 808, such as storage 810 and a processor 812. The VM allocator 118 can operate as an application, application part, and/or with the operating system.

Configuration 802(2) is organized into one or more shared resources 814, such as storage 810 and processor 812, dedicated resources 816, and an interface 818 between them. The VM allocator 118 can operate with the shared resources 814 and/or the dedicated resource 816.

The VM allocator 118 can function in a stand-alone manner. Alternatively, the VM allocator can operate cooperatively with other computers. For instance, the VM allocator may be associated with a set of cooling systems and other VM allocators may be associated with other sets of cooling systems. A master VM allocator or other entity may coordinate the function of the various VM allocators to accomplish workloads across multiple disaggregated systems. For instance, a VM allocator 118 positioned on the communication hub 116 could manage all compute functionality associated with a disaggregated system. Alternatively, the local VM allocator on the communication hub could perform some management functionality for the disaggregated system and could communicate with a remote VM allocator that performed other management functionality.

In some implementations, the VM allocator 118 can be implemented on computer-readable storage media that can be executed by a processor. As used herein, the term "computer-readable media" can include signals. In contrast, the term "computer-readable storage media" excludes signals. Computer-readable storage media includes "computer-readable storage devices." Examples of computer-readable storage devices include volatile storage media, such as RAM, and non-volatile storage media, such as hard drives, optical discs, and flash memory, among others.

Figure 9:
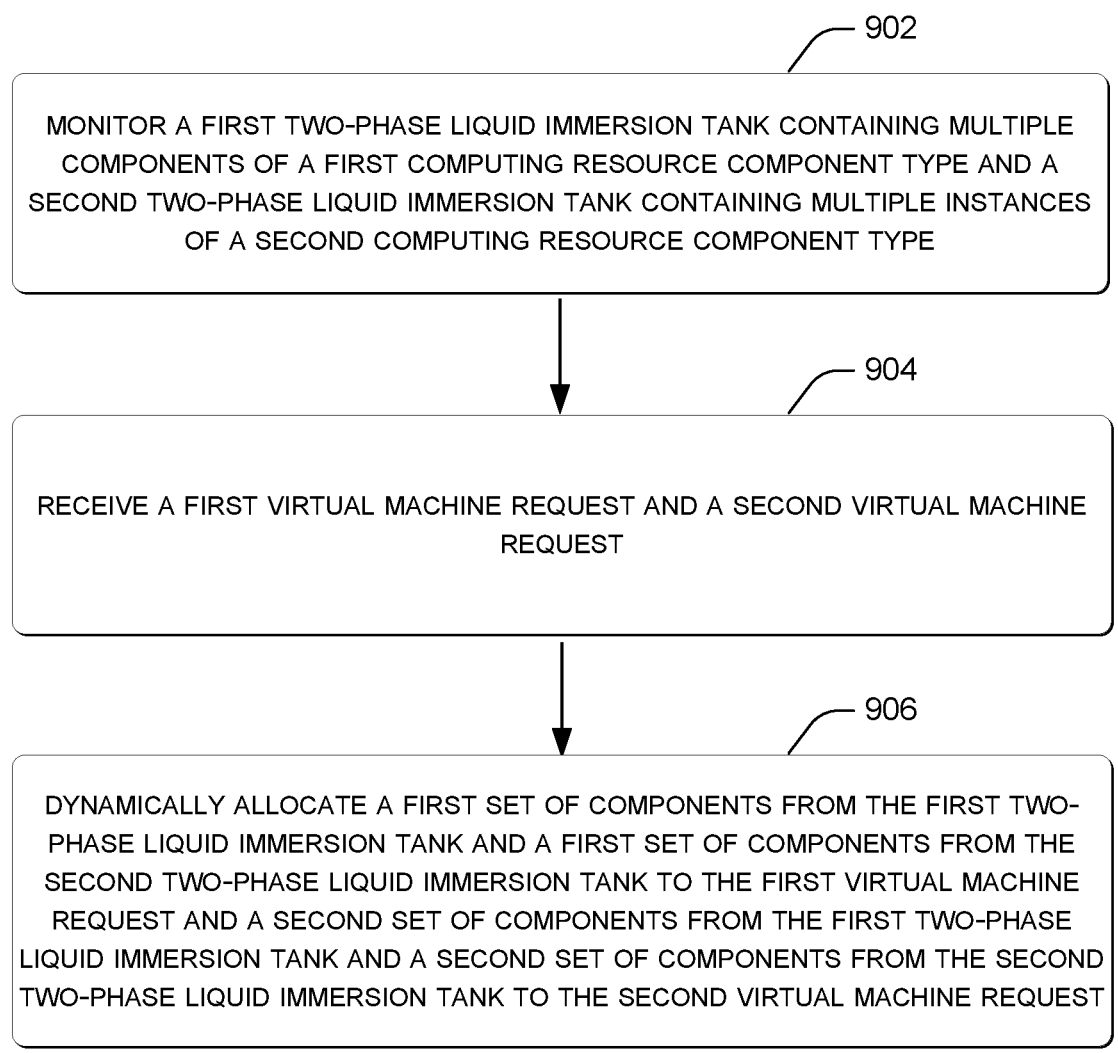
FIGS. 9 and 10 show flowcharts of example disaggregation methods that can implement some of the present concepts in accordance with some implementations.

FIG. 9 shows an example flowchart of a disaggregated compute technique or method 900.

The method can monitor a first two-phase liquid immersion tank containing multiple components of a first computing resource component type and a second two-phase liquid immersion tank containing multiple components of a second computing resource component type at 902. In at least some implementations, each two-phase liquid immersion tank only contains one type of component. The properties of the liquid can be selected based upon the properties of the components of the component type and/or expected operation of the components of the component type.

The method can receive a first virtual machine request and a second virtual machine request at 904.

The method can dynamically allocate a first set of components from the first two-phase liquid immersion tank and a first set of components from the second two-phase liquid immersion tank to the first virtual machine request and a second set of components from the first two-phase liquid immersion tank and a second set of components from the second two-phase liquid immersion tank to the second virtual machine request at 906. Each tank can be managed based at least in part upon the properties of the liquid in the tank, the properties of the components in the tank, the virtual machine request, and/or workload of the virtual machine request at a specific instance in time. In some cases, the dynamically allocating can entail replacing defective individual components in the first two-phase liquid immersion tank without changing allocations in the second two-phase liquid immersion tank.

Figure 10:
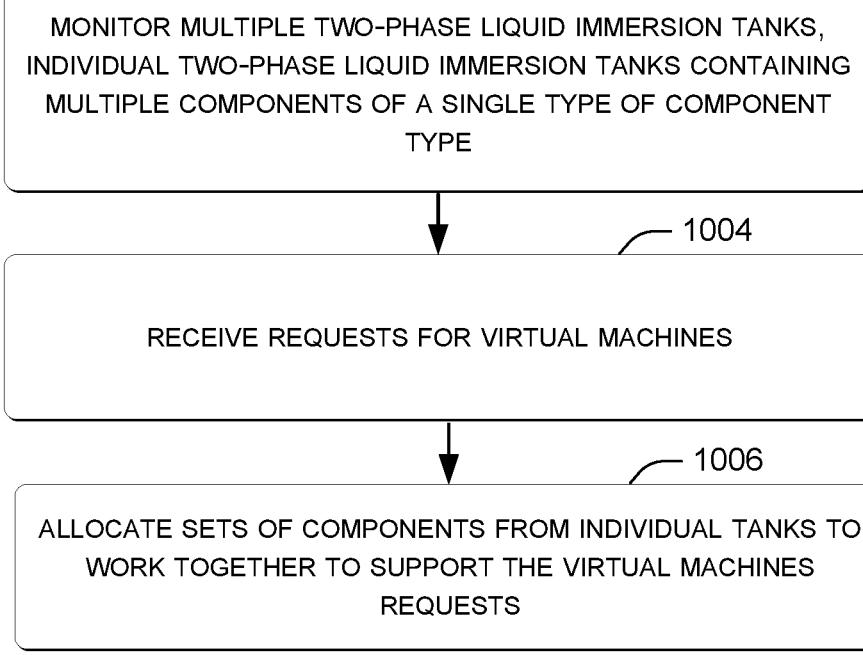

FIG. 10 illustrates an example flowchart of a disaggregated compute technique or method 1000.

The method can monitor multiple two-phase liquid immersion tanks, individual two-phase liquid immersion tanks containing multiple components of a single type of component type at block 1002.

The method can receive requests for virtual machines at block 1004.

The method can allocate sets of components from individual two-phase liquid immersion tanks to work together to support the virtual machine requests at block 1006. In some cases, the allocating can include powering the sets of components from the individual two-phase liquid immersion tanks to satisfy the virtual machine requests. The power can cause heat from the sets of components to boil some of the liquid in the individual two-phase liquid immersion tanks without exceeding the maximum operating temperature of individual components of the sets of components.

The described methods can be performed by the systems and/or elements described above and/or below, and/or by other devices and/or systems.

The order in which the methods are described is not intended to be construed as a limitation, and any number of the described acts can be combined in any order to implement the method, or an alternate method. Furthermore, the method can be implemented in any suitable hardware, software, firmware, or combination thereof, such that a device can implement the method. In one case, the method is stored on one or more computer-readable storage medium/media as a set of instructions (e.g., computer-readable instructions or computer-executable instructions) such that execution by a processor causes the processor to perform the method.

Various examples are described above. Additional examples are described below. One example includes a system comprising a first liquid immersion tank containing multiple components of a first computing resource component type and no components of a second computing resource component type, the first liquid immersion tank comprising a first liquid having a boiling point within an operating temperature range of the first computing resource component type, a second liquid immersion tank containing multiple components of the second computing resource component type and no components of the first computing resource component type, the second liquid immersion tank comprising a second liquid having a boiling point within an operating temperature range of the second computing resource component type, and a communication hub communicatively coupled to the multiple components of the first computing resource component type in the first liquid immersion tank and the multiple components of the second computing resource component type in the second liquid immersion tank.

Another example can include any of the above and/or below examples where the first computing resource component type comprises central processing units and the second computing resource component type comprises memory.

Another example can include any of the above and/or below examples where the system further comprises a third liquid immersion tank containing multiple components of a third computing resource component type comprising graphical processing units and further comprising a fourth liquid immersion tank containing multiple components of a fourth computing resource component type comprising storage.

Another example can include any of the above and/or below examples where the system further comprises a fifth liquid immersion tank containing multiple components of a fifth computing resource component type comprising accelerators and further comprising a sixth liquid immersion tank containing multiple components of a sixth computing resource component type comprising flash memory.

Another example can comprise each of these liquid immersion tanks comprising two phase liquid immersion tanks that include the specified component type and no components of other component types.

Another example can include any of the above and/or below examples where the system comprises a seventh liquid immersion tank containing multiple components of a seventh computing resource component type comprising overclocked processors.

Another example can include any of the above and/or below examples where the first liquid immersion tank, the second liquid immersion tank, the third liquid immersion tank, the fourth liquid immersion tank, the fifth liquid immersion tank, the sixth liquid immersion tank, and the seventh liquid immersion tank are positioned radially around the communication hub.

Another example can include any of the above and/or below examples where the first liquid immersion tank, the second liquid immersion tank, the third liquid immersion tank, the fourth liquid immersion tank, the fifth liquid immersion tank, the sixth liquid immersion tank, and the seventh liquid immersion tank are positioned substantially equal distances from the communication hub.

Another example can include any of the above and/or below examples where the first liquid immersion tank, the second liquid immersion tank, the third liquid immersion tank, the fourth liquid immersion tank, the fifth liquid immersion tank, the sixth liquid immersion tank, and the seventh liquid immersion tank are all contained within a four cubic foot volume.

Another example can include any of the above and/or below examples where the system further comprises first communication lines extending between the communication hub and the multiple components of the first computing resource component type in the first liquid immersion tank, and wherein the first communication lines are less than 1 foot in length and further comprising second communication lines extending between the communication hub and the multiple components of the second computing resource component type in the second liquid immersion tank, and wherein the second communication lines are less than 1 foot in length.

Another example can include any of the above and/or below examples where the communication hub is positioned in another liquid immersion tank that is centrally positioned between the first liquid immersion tank and the second liquid immersion tank.

Another example includes a system comprising a first liquid immersion tank containing multiple components of a first computing resource component type and no components of a second computing resource component type, a second liquid immersion tank containing multiple components of the second computing resource component type and no components of the first computing resource component type, and a virtual machine allocator configured to communicatively couple a first set of the first computing resource component type with a first set of the second computing resource component type to achieve a first functionality and a second set of the first computing resource component type with a second set of the second computing resource component type to achieve a second functionality.

Another example can include any of the above and/or below examples where the virtual machine allocator is configured to select the first set of the first computing resource component type with the first set of the second computing resource component type to achieve the first functionality based upon multiple parameters associated with the first liquid immersion tank and the second liquid immersion tank.

Another example can include any of the above and/or below examples where the parameters comprise current operating temperatures of the first liquid immersion tank and the second liquid immersion tank and expected operating temperatures once the first functionality and the second functionality are performed.

Another example can include any of the above and/or below examples where when the first set of the first computing resource component type and the second set of the first computing resource component type utilize more than a threshold number of the multiple components of the first computing resource component type, the virtual machine allocator can generate a signal to cause another first liquid immersion tank containing multiple components of the first computing resource component type to be communicatively coupled to the virtual machine allocator without adding another second liquid immersion tank containing multiple components of the second computing resource component type.

Another example can include any of the above and/or below examples where the first liquid immersion tank contains multiple components of a first computing resource component type that operate at overclocked rates.

Another example can include any of the above and/or below examples where the virtual machine allocator is configured to control the first set of the first computing resource component type at overclock rates that avoid exceeding a specified maximum operating temperature of the first computing resource component type while achieving the first functionality.

Another example can include any of the above and/or below examples where the virtual machine allocator is configured to control the first set of the first computing resource component type by adjusting at least one parameter relating to a number of components contributing to the first functionality, a clock rate, or a temperature associated with the first liquid immersion tank.

Another example includes a device implemented method comprising monitoring a first two-phase liquid immersion tank containing multiple components of a first computing resource component type and a second two-phase liquid immersion tank containing multiple components of a second computing resource component type, receiving a first virtual machine request and a second virtual machine request, and dynamically allocating a first set of components from the first two-phase liquid immersion tank and a first set of components from the second two-phase liquid immersion tank to the first virtual machine request and a second set of components from the first two-phase liquid immersion tank and a second set of components from the second two-phase liquid immersion tank to the second virtual machine request.

Another example can include any of the above and/or below examples where the dynamically allocating comprises replacing defective individual components in the first two-phase liquid immersion tank without changing allocations in the second two-phase liquid immersion tank.

Another example includes a device implemented method comprising monitoring multiple two-phase liquid immersion tanks, individual two-phase liquid immersion tanks containing multiple components of a single component type, receiving requests for virtual machines, and allocating sets of components from individual two-phase liquid immersion tanks to work together to support the virtual machines requests.

Another example can include any of the above and/or below examples where the allocating further comprises powering the sets of components from the individual two-phase liquid immersion tanks to satisfy the virtual machine requests, where the power causes heat from the sets of components to boil some of the liquid in the individual two-phase liquid immersion tanks without exceeding the maximum operating temperature of individual components of the sets of components.

CONCLUSION

Although the subject matter relating to disaggregated computing has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A system, comprising:
   a first liquid immersion tank containing multiple components of a first computing resource component type and no components of a second computing resource component type, the first liquid immersion tank comprising a first liquid having a boiling point within an operating temperature range of the first computing resource component type;
   a second liquid immersion tank containing multiple components of the second computing resource component type and no components of the first computing resource component type, the second liquid immersion tank comprising a second liquid having a boiling point within an operating temperature range of the second computing resource component type; and,
   a communication hub communicatively coupled to the multiple components of the first computing resource component type in the first liquid immersion tank and the multiple components of the second computing resource component type in the second liquid immersion tank.

2. The system of claim 1, wherein the first computing resource component type comprises central processing units and the second computing resource component type comprises memory.

3. The system of claim 2, further comprising a third liquid immersion tank containing multiple components of a third computing resource component type comprising graphical processing units and further comprising a fourth liquid immersion tank containing multiple components of a fourth computing resource component type comprising storage.

4. The system of claim 3, further comprising a fifth liquid immersion tank containing multiple components of a fifth computing resource component type comprising accelerators and further comprising a sixth liquid immersion tank containing multiple components of a sixth computing resource component type comprising flash memory.

5. The system of claim 4, further comprising a seventh liquid immersion tank containing multiple components of a seventh computing resource component type comprising overclocked processors.

6. The system of claim 5, wherein the first liquid immersion tank, the second liquid immersion tank, the third liquid immersion tank, the fourth liquid immersion tank, the fifth liquid immersion tank, the sixth liquid immersion tank, and the seventh liquid immersion tank are positioned radially around the communication hub.

7. The system of claim 5, wherein the first liquid immersion tank, the second liquid immersion tank, the third liquid immersion tank, the fourth liquid immersion tank, the fifth liquid immersion tank, the sixth liquid immersion tank, and the seventh liquid immersion tank are positioned substantially equal distances from the communication hub.

8. The system of claim 5, wherein the first liquid immersion tank, the second liquid immersion tank, the third liquid immersion tank, the fourth liquid immersion tank, the fifth liquid immersion tank, the sixth liquid immersion tank, and the seventh liquid immersion tank are all contained within a four cubic foot volume.

9. The system of claim 1, further comprising first communication lines extending between the communication hub and the multiple components of the first computing resource component type in the first liquid immersion tank, and wherein the first communication lines are less than 1 foot in length and further comprising second communication lines extending between the communication hub and the multiple components of the second computing resource component type in the second liquid immersion tank, and wherein the second communication lines are less than 1 foot in length.

10. The system of claim 1, wherein the communication hub is positioned in another liquid immersion tank that is centrally positioned between the first liquid immersion tank and the second liquid immersion tank.

* * * * *